(12) United States Patent
Parker et al.

(10) Patent No.: US 8,165,865 B2
(45) Date of Patent: Apr. 24, 2012

(54) MODELING AND SIMULATION METHOD

(75) Inventors: Daniel Robin Parker, High Peak (GB);
Christopher Jones, Manchester (GB);
Jason Sotiris Polychronopoulos,
Manchester (GB)

(73) Assignee: Mentor Graphics Corporation,
Wilsonville, OR (US)

( * ) Notice: Subject to any disclaimer, the term of this patent is extended or adjusted under 35 U.S.C. 154(b) by 770 days.

(21) Appl. No.: 12/161,559

(22) PCT Filed: Jan. 18, 2007

(86) PCT No.: PCT/GB2007/000168
§ 371 (c)(1),
(2), (4) Date: Jul. 18, 2008

(87) PCT Pub. No.: WO2007/083134
PCT Pub. Date: Jul. 26, 2007

(65) Prior Publication Data
US 2010/0223042 A1     Sep. 2, 2010

(30) Foreign Application Priority Data

Jan. 20, 2006 (GB) .................................. 0601135.7

(51) Int. Cl.
*G06F 17/50* (2006.01)
*G06F 3/00* (2006.01)

(52) U.S. Cl. .................. 703/14; 703/21; 703/22; 716/3; 716/103; 717/114; 717/152

(58) Field of Classification Search ...................... 703/14, 703/22, 21; 717/114, 152; 716/3, 103
See application file for complete search history.

(56) References Cited

U.S. PATENT DOCUMENTS

| 6,691,301 | B2 * | 2/2004 | Bowen | 717/114 |
|---|---|---|---|---|
| 7,000,213 | B2 * | 2/2006 | Banerjee et al. | 716/103 |
| 7,085,702 | B1 * | 8/2006 | Hwang et al. | 703/15 |
| 7,657,416 | B1 * | 2/2010 | Subasic et al. | 703/13 |
| 2002/0152061 | A1 * | 10/2002 | Shimogori et al. | 703/21 |
| 2004/0019883 | A1 * | 1/2004 | Banerjee et al. | 717/152 |
| 2005/0091026 | A1 * | 4/2005 | Hodgson et al. | 703/22 |
| 2005/0198606 | A1 | 9/2005 | Gupta et al. | |
| 2007/0168893 | A1 * | 7/2007 | Watanabe et al. | 716/3 |

(Continued)

FOREIGN PATENT DOCUMENTS

EP      1 517 254 A      3/2005

OTHER PUBLICATIONS

"Standard Co-Emulation Modeling Interface (SCE-MI) Reference Manual Draft Version 1.0", downloaded from http://www.eda.org/itc/scemi.pdf on Mar. 10, 2009.

(Continued)

*Primary Examiner* — Thai Phan
(74) *Attorney, Agent, or Firm* — Klarquist Sparkman, LLP

(57) ABSTRACT

A method for modeling and simulating a system comprising first and second interrelated components is disclosed. The method comprises modeling the behavior of said first and second components using first and second specifications. Each of said first and second specifications includes a functional specification and an associated simulation element. The method further comprises simulating the behavior of said first and second components using said first and second specifications. The simulation elements communicate with one another to provide a simulation system.

37 Claims, 11 Drawing Sheets

U.S. PATENT DOCUMENTS

2008/0082786 A1* 4/2008 Lovell .............................. 712/15

OTHER PUBLICATIONS

Figure 1:
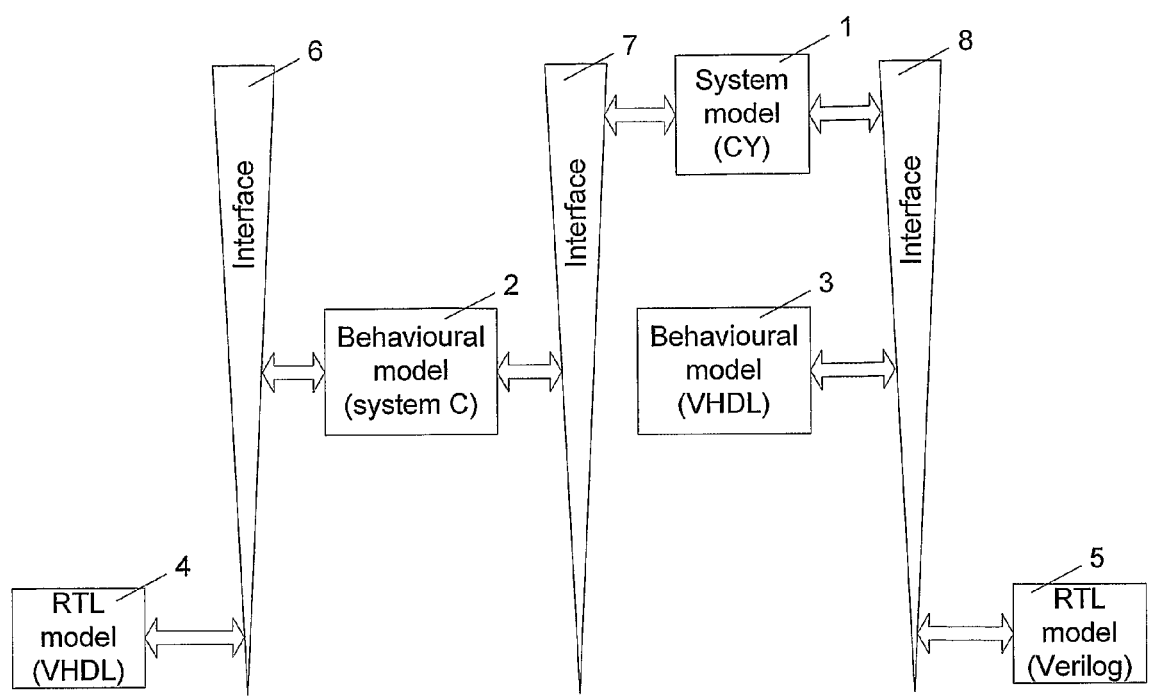

Balarin et al., "Functional Verification Methodology Based on Formal Interface Specification and Transactor Generation," Proceedings of Design Automation and Test in Europe, pp. 1-6 (Mar. 6, 2006).
Written Opinion of the International Searching Authority for International Patent Application No. PCT/GB2007/000168, 4 pp. (Jul. 20, 2008).
International Preliminary Report on Patentability for International Patent Application No. PCT/GB2007/000168, 3 pp. (Jul. 22, 2008).
International Search Report for International Patent Application No. PCT/GB2007/000168, 4 pp. (Jul. 17, 2007).
Kim et al., "Automatic Generation of Software/Hardware Co-Emulation Interface for Transaction-Level Communication," International Symposium on VLSI Design, Automation and Test, pp. 196-199 (Apr. 27, 2005).

* cited by examiner

MODELING AND SIMULATION METHOD

CROSS REFERENCE TO RELATED APPLICATIONS

This is the National Stage of International Application No. PCT/GB2007/000168, filed Jan. 18, 2007, which claims priority to Great Britain Application No. 0601135.7, filed Jan. 20, 2006, now abandoned.

The present invention relates to a modelling and simulation method.

It is known to build a model of a system and to use a simulation process to demonstrate the behaviour of that model under predefined conditions. The system may comprise two or more interrelated components. Many modelling methodologies are well known, and the particular methodology chosen is typically determined by the requirements of the system to be modelled.

One particular application of modelling and simulation methodologies is for modelling and simulating computer hardware systems prior to fabricating a prototype system. This is advantageous due to the time and expense involved in developing prototype computer hardware systems. Such modelling and simulation can substantially reduce the number of design iterations required, before arriving at a finalised design. Furthermore, modelling and simulation can increase the likelihood of the final system operating as intended due to its ability to identify problems early on in the design cycle. Once the modelling and simulation process has demonstrated that the modelled system exhibits the required behaviour, the computer hardware designers can have confidence that building an implementation of the system that is verifiably the same as the model will yield the desired results.

It is known that computer hardware systems can be considered at various levels of abstraction during their design. Furthermore, computer hardware systems can be modelled and simulated at various levels of abstraction. For example, modelling typically begins with a system specification written in a natural language such as English. Architectural and performance models are then created on the basis of this specification. Such models are often created in a high level computer programming language such as C++. Architectural and performance models are used to validate the architectural design of the system and to evaluate the performance of various design features. During this modelling phase, the system specification may be amended in the light of the results of the architectural and performance modelling. Once this process is complete, unit specifications for individual components of the system are created in a natural language and converted into specifications written in a Hardware Description Language (HDL) such as VHDL or Verilog, allowing modelling at a lower level of abstraction, such as Register Transfer Level (RTL).

The system specification described above is accompanied by appropriate system tests created from the system specification to verify the behaviour of the system. Unit tests, again created from the system specification, are used to verify the behaviour of the individual components using a simulation process. Such simulation has traditionally been carried out at a single level of abstraction, for instance RTL. This is clearly disadvantageous, as it requires the detailed RTL design to have been carried out for all components before any components can be simulated. The generation of unit specifications from the system specification described above and the creation of appropriate tests is carried out manually. This manual generation of unit specifications is time consuming and error prone. Furthermore, testing of a complete system at RTL is very time consuming both in the creation of test data and in simulation.

In an attempt to solve these problems, modelling at a higher level of abstraction has been tried using higher level features provided by programming languages such as VHDL and C++. However, significant problems were encountered, as such higher level models cannot be connected directly to RTL models. Manually creating translators between components modelled at different levels of abstraction often proves to be a task at least as complex and error prone as creating the lower level models themselves.

It is known to automate the process of simulating a system where components of the system are specified at differing levels of abstraction (for instance system level and RTL). European patent application publication number EP 1,517,254 describes a method for simulating the behaviour of first and second interrelated components within a system. The described method comprises modelling the behaviour of the components using first and second functional specifications and simulating the components in predefined circumstances. The modelled components can be at different levels of abstraction.

EP 1,517,254 describes a system in which the components are modelled entirely in software. However, in multi level modelling, the speed of simulation is limited to that of the lowest level components. This is because it is very much more computationally expensive to simulate a single component at a low level of abstraction such as RTL, rather than a higher behavioural level, due to the greater amount of detail contained within a low level model. Furthermore, prior art simulation systems, such as described within EP 1,517,254, require a separate simulator to manage the simulation process for all the modelled components. While this represents a significant computational overhead, a separate simulator is necessary in order to manage the conflicting demands of the separate modelled components for computing resources.

It is known to use a low level HDL model of a single component to program a programmable computing device to implement that model in hardware. A "programmable computing device" as that term is used herein, may be a single programmable chip. Alternatively, the programmable computing device may comprise multiple interconnected programmable chips. Furthermore, the programmable computing device may comprise an emulator box, comprising processing elements instead of or in addition to one or more programmable chips. The HDL model determines the behaviour of the programmable computing device. The programmable computing device can be used within a simulation process to speed up the simulation of the whole system. However, this has proven to be an efficient process only when all of the components of the modelled system are modelled at the same low level. This is due to problems encountered in interfacing high level software models with low level hardware models.

If, within a modelled system, some components are implemented at a low level of abstraction in hardware and some components are implemented at a high level of abstraction in software then it is necessary to develop translators between the high level software models and the low level hardware models. Such translators may be implemented in software. However, this commonly leads to a bottle neck in the simulated system. The bottle neck is partly due to the large quantities of information required to be passed from software to hardware when information is passed to a hardware component modelled at a low level of abstraction. Additionally, the bottle neck may be caused by the large number of discrete communications incurred when communicating between software and hardware. Discrete communications occur at the start and end of each transaction. Each transaction may span multiple cycles. Even if the total quantity of information transferred between a high level software component and a low level hardware component is the same as would be the case if both components were implemented in software, the overhead of synchronising the software and hardware components reduces the speed at which information can be exchanged.

It is known to implement translators between software component models and hardware component models in hardware. Such translators are implemented within the same programmable computing device as the, or each, hardware component model. This is advantageous as it allows data to be transferred between software and hardware at a high level of abstraction, thus reducing the total quantity of data that needs to be transferred. This also advantageously reduces bottle necks caused by the synchronisation of data exchange between hardware and software components.

The hardware translator translates the data to the lower level of abstraction required by the low level hardware models. However, hitherto, such hardware translators have been implemented manually. This is a laborious and error prone process. There is no known method of automatically and accurately simulating a system when parts of the system are specified and modelled in software at a high level (e.g. system level) and parts of the system are specified and modelled in hardware at a low level (e.g. RTL).

It is an object of embodiments of the present invention to obviate or mitigate one or more of the problems of the prior art, whether identified herein or elsewhere.

According to a first aspect of the present invention there is provided a method for modelling and simulating a system comprising first and second interrelated components, the method comprising: modelling the behaviour of said first and second components using first and second specifications, each of said first and second specifications including a functional specification and an associated simulation element; and simulating the behaviour of said first and second components using said first and second specifications; wherein the simulation elements communicate with one another to provide a simulation system.

An advantage of the first aspect of the present invention is that the simulation elements collectively form a distributed simulation system, which controls the simulation of hardware implemented components. In certain embodiments of the present invention, by having a distributed simulation system comprising elements within the components to be simulated it is not necessary to have a separate entity responsible for controlling the simulation of the hardware implemented elements.

Said simulation system may manage communication between the first and second specifications representing the first and second components.

Said simulation system may determine the order in which the first and second specifications representing the first and second components process events.

Said step of simulating may further comprise instantiating at least one first entity within a hierarchy of interrelated entities, said at least one first entity being defined by at least one of said first and second functional specifications.

The method may further comprise instantiating at least one further entity in response to the or each instantiated first entity, the or each further entity being defined by at least one of the first and second functional specifications, and the or each further entity being selected by the simulation system on the basis of its hierarchical relationship with the at least one first entity.

Said first and second components may be represented by respective entities in said hierarchy of interrelated entities, and instances of the respective entities are created.

The at least one further entity may be a parent of the at least one first entity in the hierarchy of interrelated entities. Alternatively, the at least one further entity may be a child of the at least one first entity in the hierarchy of interrelated entities.

An entity within the hierarchy may be instantiated to represent data transmitted between the first and second components, and communication between the first and second specifications representing the first and second components is modelled.

The first component may be modelled at a higher level of abstraction than the second component, and the method comprises providing details of the relationship between the first and second components using said hierarchy.

Hierarchical relationships between the entities may be deduced from at least one of the first and second functional specifications.

Said first and second specifications may be specified as a first computer program written in a first computer programming language. The method may further comprise specifying relationships between said first and second specifications in the first computer program.

The method may further comprise processing said first computer program to generate a second computer program. Said processing may translate said first computer program from the first computer programming language to a second computer programming language. Said second computer programming language may be VHDL or Verilog.

The method may further comprise generating implementations of said first and second components in hardware based upon said second computer program.

Said processing may comprise inserting additional computer code into said second computer program, said additional computer code implementing the or each simulation element.

The method may further comprise processing said first computer program to generate a second computer program and a third computer program. Said processing may translate said first computer program from the first computer programming language to second and third computer programming languages respectively. Said second computer programming language may be VHDL or Verilog and said third computer programming language may be C or C++. Said first component may be implemented in hardware, and said second component may be implemented in software.

The method may further comprise modelling the behaviour of at least one further component using at least one further functional specification; generating an implementation of said at least one further component in software based upon said at least one further functional specification; and simulating the behaviour of said at least one further component using said at least one further functional specification.

The method may further comprise the step of providing a software implemented simulation system for managing communication between said first and second components and said at least one further component.

The method may further comprise said first and second specifications representing the first and second components attempting to communicate with further components simultaneously via the software implemented simulation system and via other specifications representing other components implemented in hardware.

The second computer program may comprise an implementation of a finite state machine configured to instantiate entities at a higher hierarchical level on the basis of at least one entity at a lower hierarchical level in response to the simulation.

The second computer program may comprise an implementation of a finite state machine configured to instantiate entities at a lower hierarchical level on the basis of at least one entity at a higher hierarchical level in response to the simulation.

The second computer program may comprise an implementation of a finite state machine configured to instantiate entities at both higher and lower hierarchical levels on the basis of at least one entity at a lower or a higher hierarchical level respectively in response to the simulation.

According to a second aspect of the present invention there is provided a programmable computing device comprising: storage means storing first and second specifications, said first and second specifications respectively modelling the behaviour of first and second components, and each of said first and second specifications including a functional specification and a simulation element; processing means configured to simulate the behaviour of said first and second components using said first and second specifications; wherein said simulation elements are configured to communicate with one another to provide a simulation system.

According to a third aspect of the present invention there is provided an apparatus for modelling and simulating a system comprising first and second interrelated components, the apparatus comprising: modelling means for modelling the behaviour of said first and second components using first and second specifications, each of said first and second specifications including a functional specification and an associated simulation element; and simulation means for simulating the behaviour of said first and second components using said first and second specifications; wherein the simulation elements communicate with one another to provide a simulation system.

According to a fourth aspect of the present invention there is provided a method for modelling and simulating a system comprising a component, the method comprising: modelling the behaviour of the component using a specification specified in a first computer program written in a first computer programming language; processing the first computer program to generate a second computer program; generating an implementation of the component based on the second computer program; and simulating the behaviour of the component using the generated implementation by instantiating a first entity within a hierarchy of entities; wherein the second computer program comprises an implementation of a finite state machine configured to instantiate entities at both higher and lower levels within the hierarchy of entities in response to the simulation.

An advantage of the fourth aspect of the present invention is that by having a single component configured to instantiate entities at higher and lower levels within the hierarchy of entities the complexity of the modelling and simulating system can be reduced.

The system may comprise at least first and second interrelated components each specification includes a functional specification and an associated simulation element wherein the simulation elements communicate with one another to provide a simulation system.

Said simulation system may implement the finite state machine.

Said simulation system may manage communication between the first and second specifications representing the first and second components.

Said simulation system may determine the order said first and second components process events.

The method may further comprise instantiating at least one further entity in response to the or each instantiated first entity, the or each further entity being defined by at least one of first and second functional specifications, and the or each further entity instantiated in response to the simulation is selected by the simulation system on the basis of its hierarchical relationship with the first entity.

Said first and second components may be represented by respective entities in said hierarchy of interrelated entities, and instances of the respective entities are created. Said at least one further entity may be a parent of the at least one first entity in the hierarchy of interrelated entities. Said at least one further entity may be a child of the at least one first entity in the hierarchy of interrelated entities.

An entity within the predetermined hierarchy may be instantiated to represent data transmitted between the first and second specifications representing the first and second components, and communication between the first and second components is modelled.

The first component may be modelled at a higher level of abstraction than the second component, and the method comprises providing details of the relationship between the first and second components using said hierarchy.

Hierarchical relationships between the entities may be deduced from at least one of the first and second functional specifications.

Said processing may translate said first computer program from the first computer programming language to a second computer programming language. Said second computer programming language may be VHDL or Verilog.

The method may further comprise generating implementations of said first and second components in hardware based upon said second computer program.

Said processing may comprise inserting additional computer code into said second computer program, said additional computer code implementing the or each simulation element.

According to a fifth aspect of the present invention there is provided a programmable computing device comprising: storage means storing a specification, said specification modelling the behaviour of the component, and the specification being specified in a first computer program; first processing means configured to process the first computer program to generate a second computer program; generating means configured to generate an implementation of the component based on the second computer program; and second processing means configured to simulate behaviour of the component using the generated implementation by instantiating a first entity within a hierarchy of entities; wherein the second computer program comprises an implementation of a finite state machine configured to instantiate entities at both higher and lower levels within the hierarchy of entities in response to the simulation.

According to a sixth aspect of the present invention there is provided an apparatus for modelling and simulating a system comprising a component, the method comprising: modelling means for modelling the behaviour of the component using a specification specified in a first computer program written in a first computer programming language; processing means for processing the first computer program to generate a second computer program; generation means for generating an implementation of the component based on the second computer program; and simulation means for simulating the behaviour of the component using the generated implementation by instantiating a first entity within a hierarchy of entities; wherein the second computer program comprises an implementation of a finite state machine configured to instantiate entities at both higher and lower levels within the hierarchy of entities in response to the simulation.

According to a seventh aspect of the present invention there is provided a method for modelling and simulating a system comprising first and second interrelated components, the method comprising: modelling the behaviour of said first and second components using first and second specifications specified in a computer program in a first computer programming language; processing said computer program to generate second and third computer programs in second and third computer programming languages respectively; generating an implementation of the first component in hardware based on the second computer program; generating an implementation of the second component in software based on the third computer program; and simulating the behaviour of the first component and the second component using the generated implementation of the first component and the generated implementation of the second component respectively.

An advantage of the seventh aspect of the present invention is that by generating implementations of components in hardware and software, the components being specified in a single computer program in a first programming language, the speed of simulation of the first computer program can be increased. This is because by implementing certain components of a system in hardware the speed of simulation is increased, without requiring these components to be specified separately from the rest of the system, which is implemented in software.

The first specification may include a functional specification and an associated simulation element and wherein the simulation element is arranged to communicate with one other simulation elements to provide a simulation system, the method further comprising providing a software implemented simulation system for managing communication between the specification representing the second component and said at least one further component.

Said simulation system may manage communication between said first and second specifications representing the first and second components.

Said simulation system may determine the order said first and second specifications representing the first and second components process events.

Said simulating may further comprise instantiating at least one first entity within a hierarchy of interrelated entities, said at least one first entity being defined by at least one of the first and second functional specifications.

The method may further comprise instantiating at least one further entity in response to the or each instantiated first entity, the or each further entity being defined by at least one of the first and second functional specifications, and the or each further entity being selected by the simulation system on the basis of its hierarchical relationship with the at least one first entity.

Said first and second components may be represented by respective entities in said hierarchy of interrelated entities, and instances of the respective entities are created.

Said at least one further entity may be a parent of the at least one first entity in the hierarchy of interrelated entities. Alternatively, said at least one further entity may be a child of the at least one first entity in the hierarchy of interrelated entities.

An entity within the hierarchy may be instantiated to represent data transmitted between the first and second specifications representing the first and second components, and communication between the first and second components is modelled.

The first component may be modelled at a higher level of abstraction than the second component, and the method comprises providing details of the relationship between the first and second components using said hierarchy.

Hierarchical relationships between the entities may be deduced from at least one of the first and second specifications.

Said processing may comprise inserting additional computer code into said second and third computer programs, said additional computer code implementing the or each simulation element.

Said second programming language may be VHDL or Verilog and said third programming language may be C or C++.

According to a eight aspect of the present invention there is provided a programmable computing device comprising: storage means storing first and second specifications, said first and second specification respectively modelling the behaviour of said first and second components, said first and second specification being specified in a computer program in a first computer programming language; processing means configured for processing said computer program to generate second and third computer programs in second and third computer programming languages respectively; first generation means configured for generating an implementation of the first component in hardware based on the second computer program; second generation means configured for generating an implementation of the second component in software based on the third computer program; and simulation means configured for simulating the behaviour of the first component and the second component using the generated implementation of the first component and the generated implementation of the second component respectively.

According to a ninth aspect of the present invention there is provided a apparatus for modelling and simulating a system comprising a component, the apparatus comprising: modelling means for modelling the behaviour of said first and second components using first and second specifications specified in a computer program in a first computer programming language; processing means for processing said computer program to generate second and third computer programs in second and third computer programming languages respectively; first generation means for generating an implementation of the first component in hardware based on the second computer program; second generation means for generating an implementation of the second component in software based on the third computer program; and simulation means for simulating the behaviour of the first component and the second component using the generated implementation of the first component and the generated implementation of the second component respectively.

According to a tenth aspect of the present invention there is provided a carrier medium carrying computer readable code for controlling a computer to carry out any of the above methods.

According to an eleventh aspect of the present invention there is provided a computer apparatus for modelling and simulating a system, the apparatus comprising: a program memory storing processor readable instructions; and a processor configured to read and execute instructions stored in said program memory; wherein the processor readable instructions comprise instructions controlling the processor to carry out any of the above methods.

The phrase "implemented in hardware" as used herein is intended to mean the use of a HDL model of a component to program a programmable computing device. The phrase "implemented in software" as used herein is intended to mean the implementation of a model of a component written in a computer programming language in software running on a computer apparatus.

Figure 2:
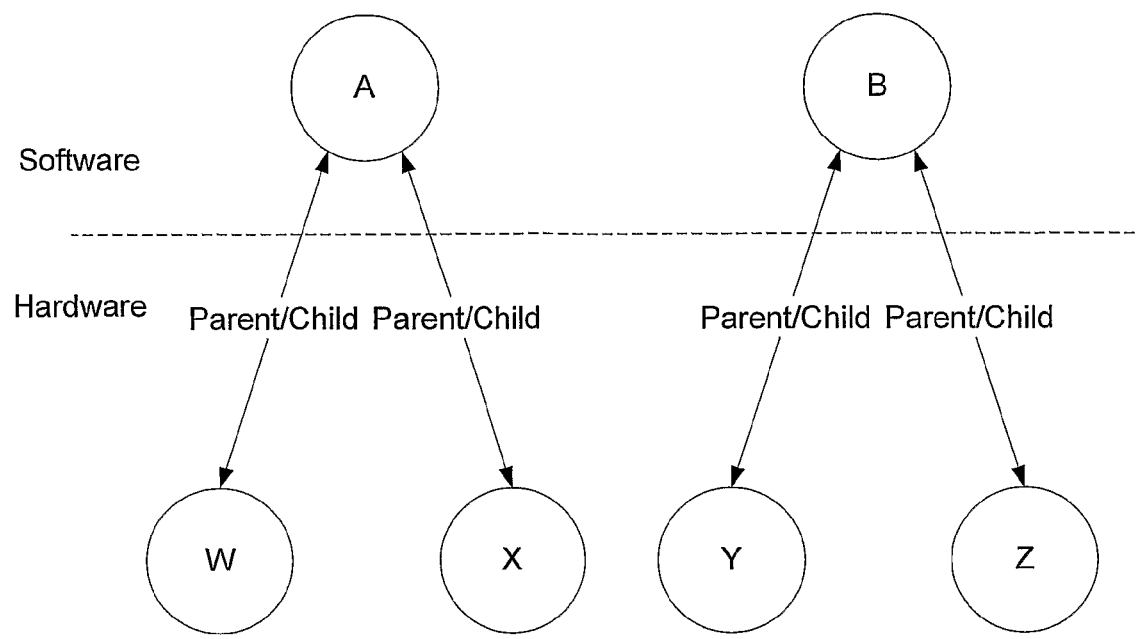
Figure 3:
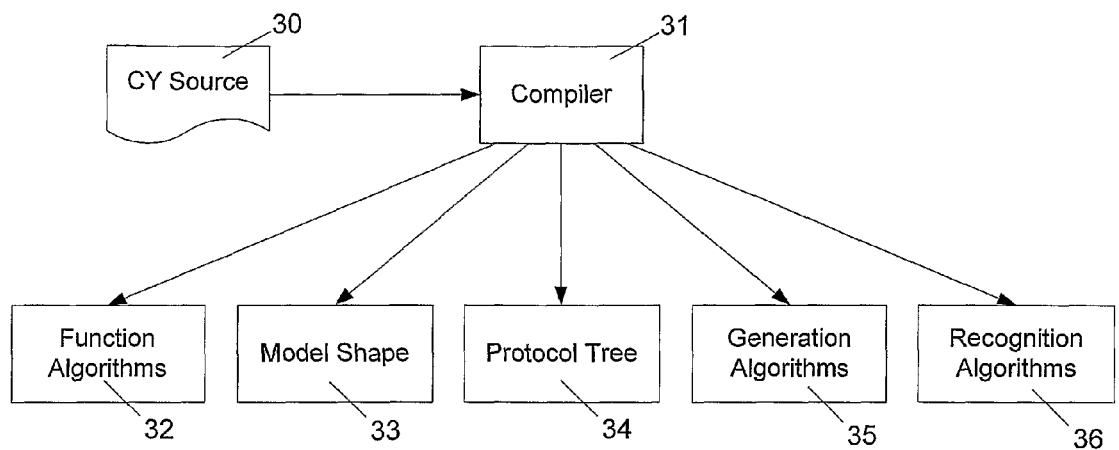
Figure 4:
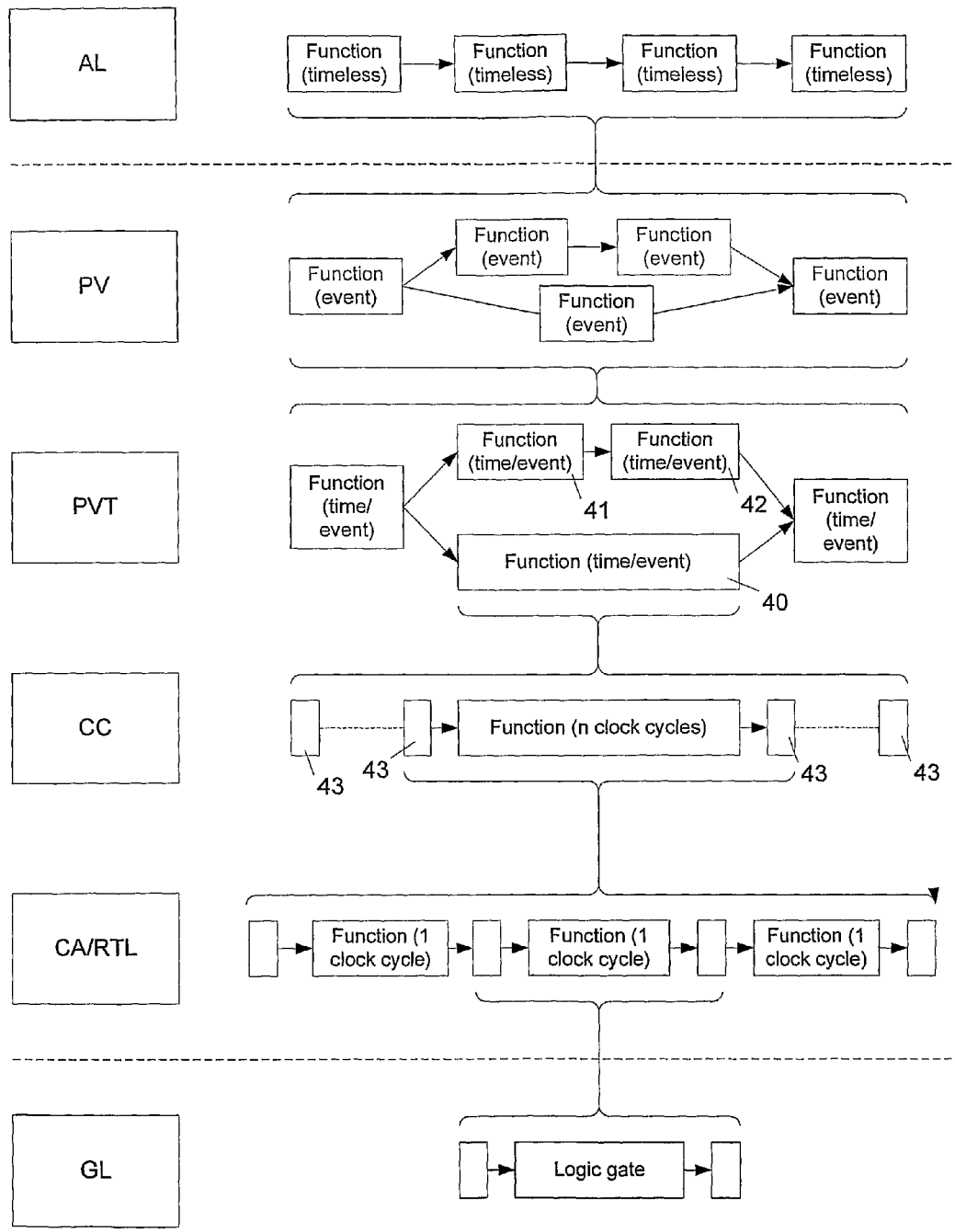
Figure 5:
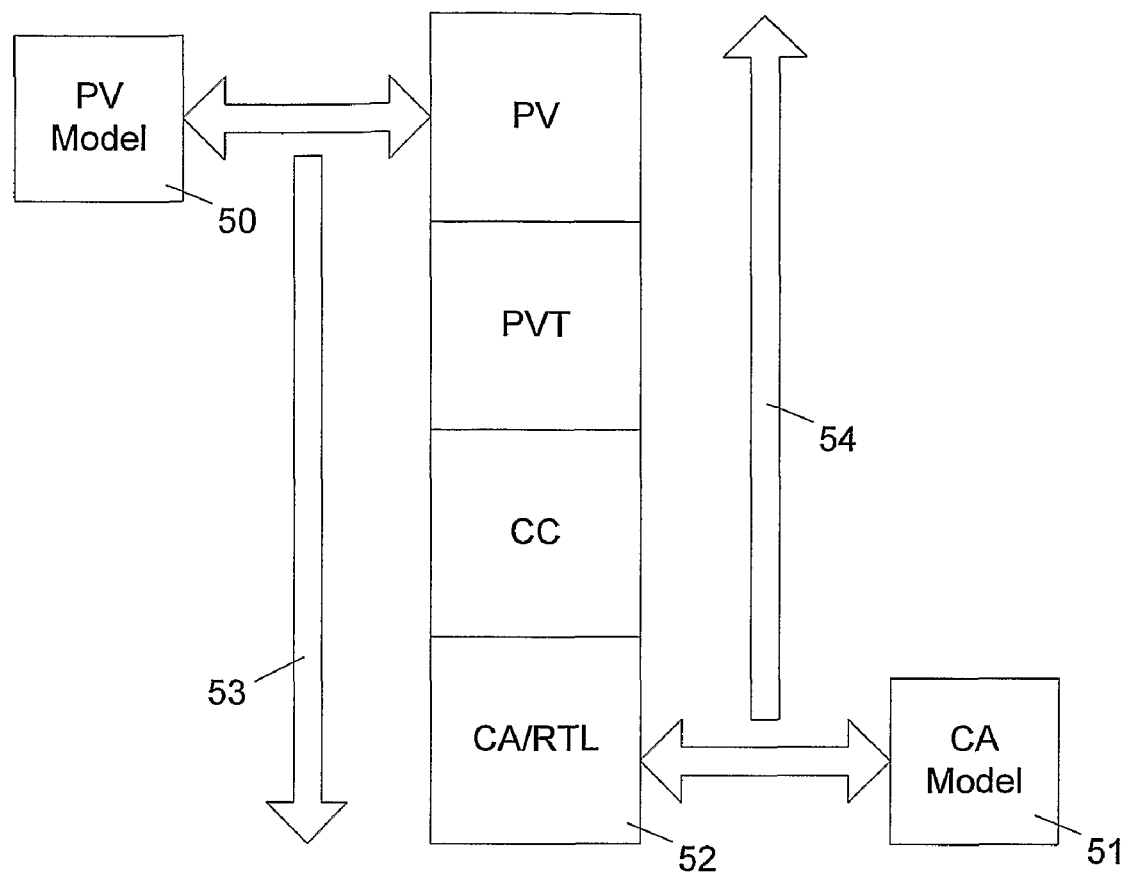
Figure 6:
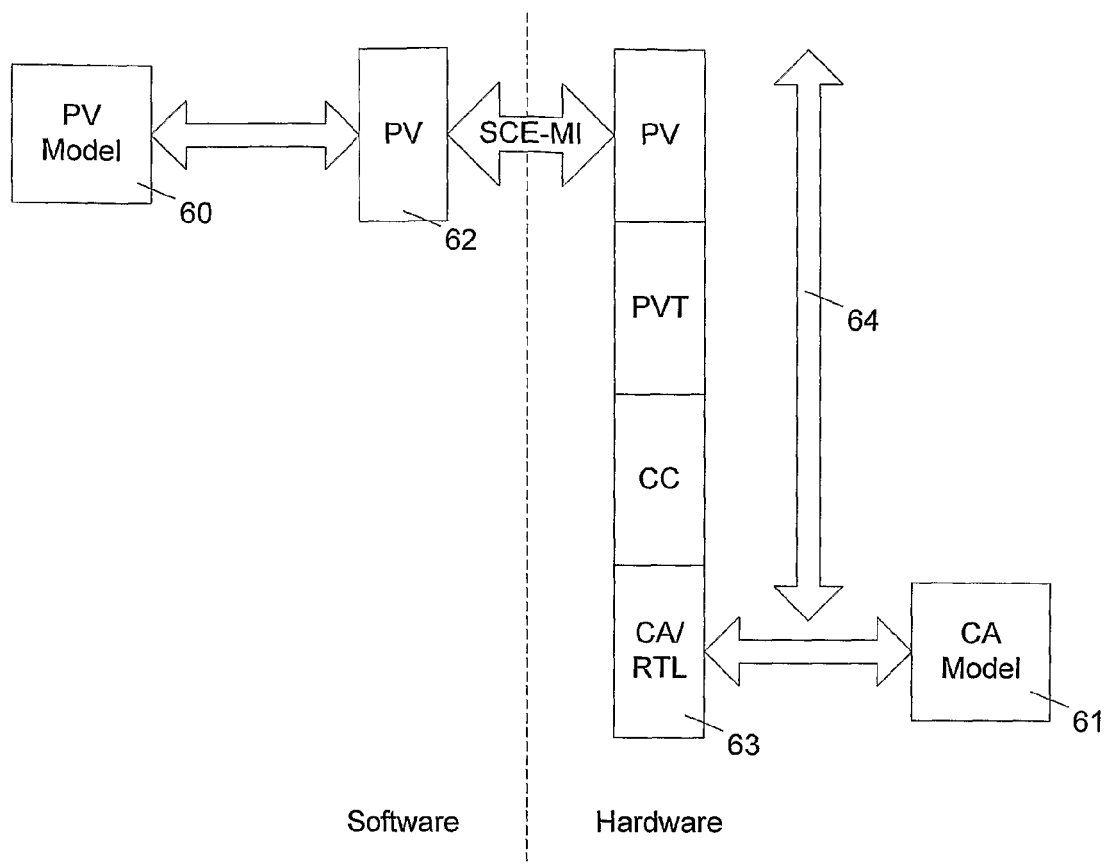
Figure 7:
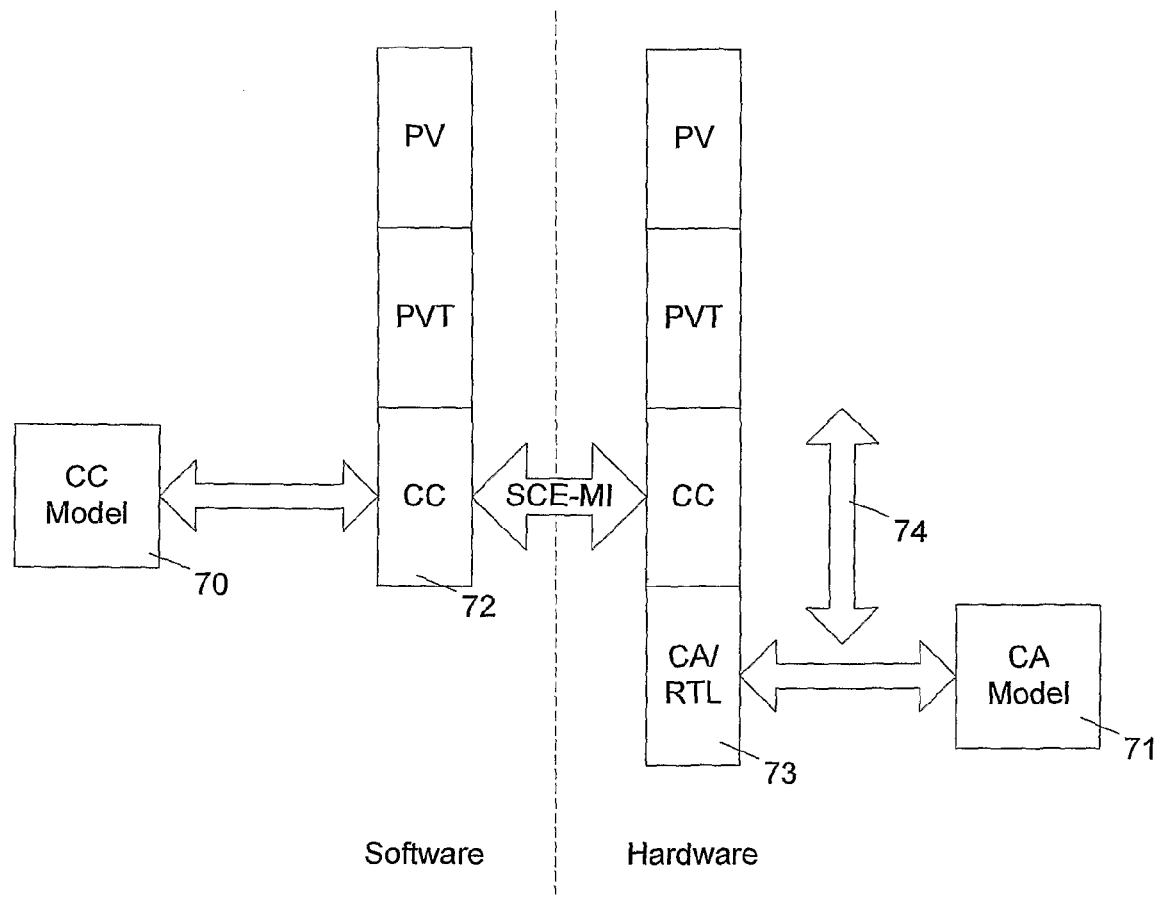
Figure 8:
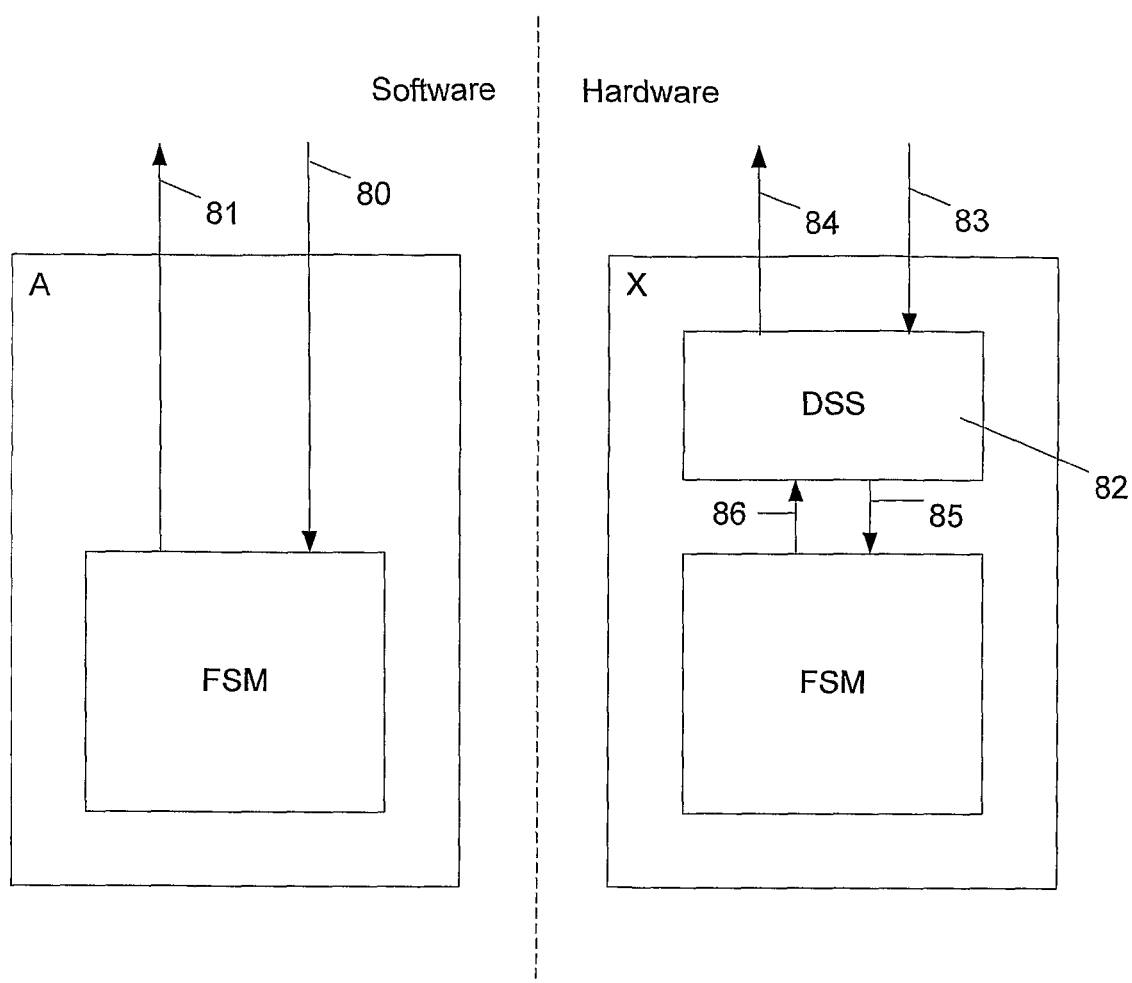
Figure 9:
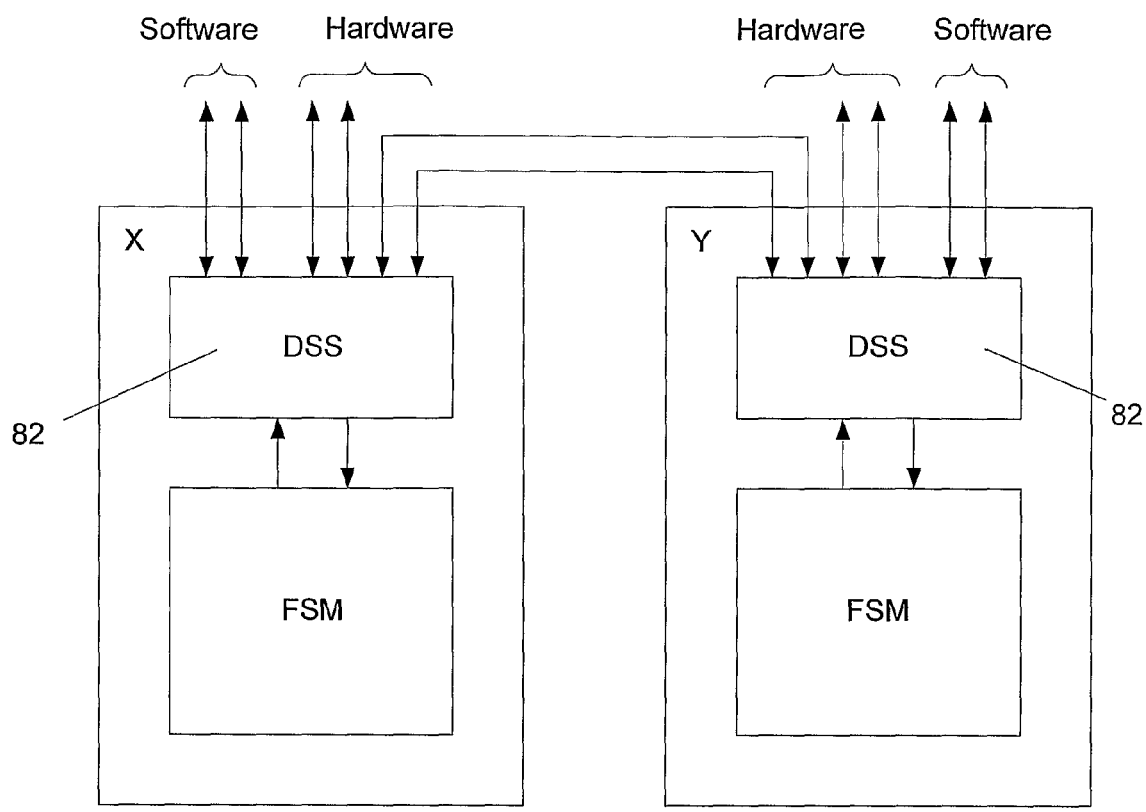
Figure 10:
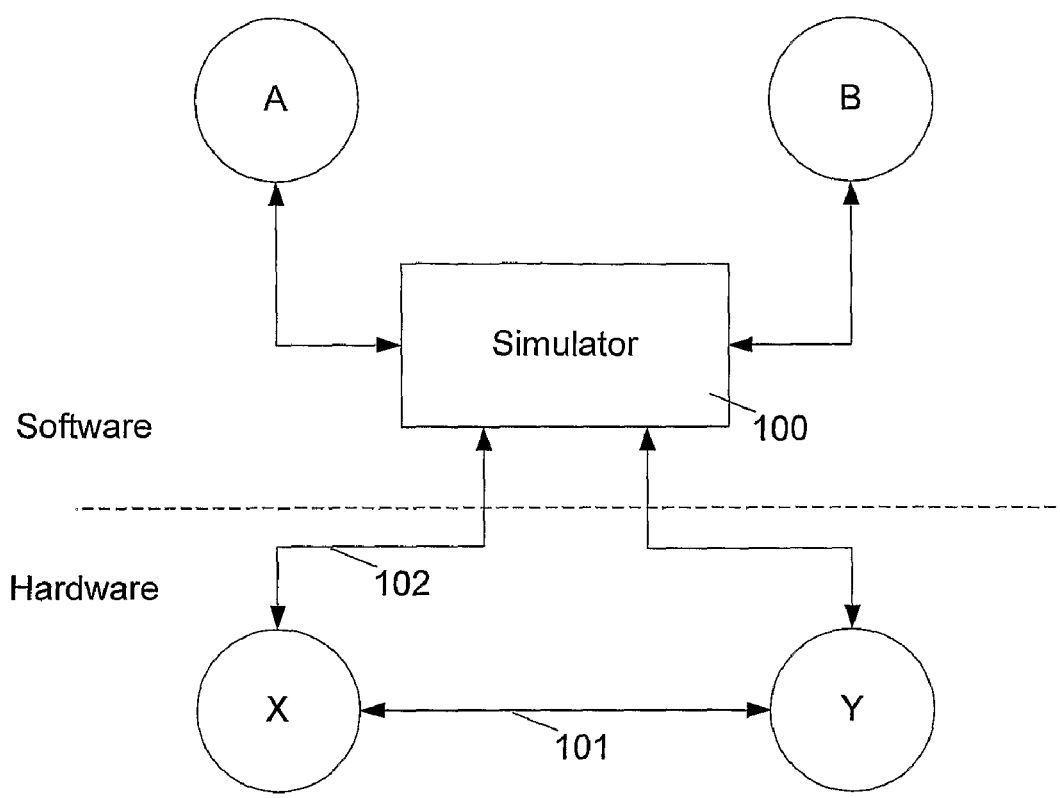
Figure 11:
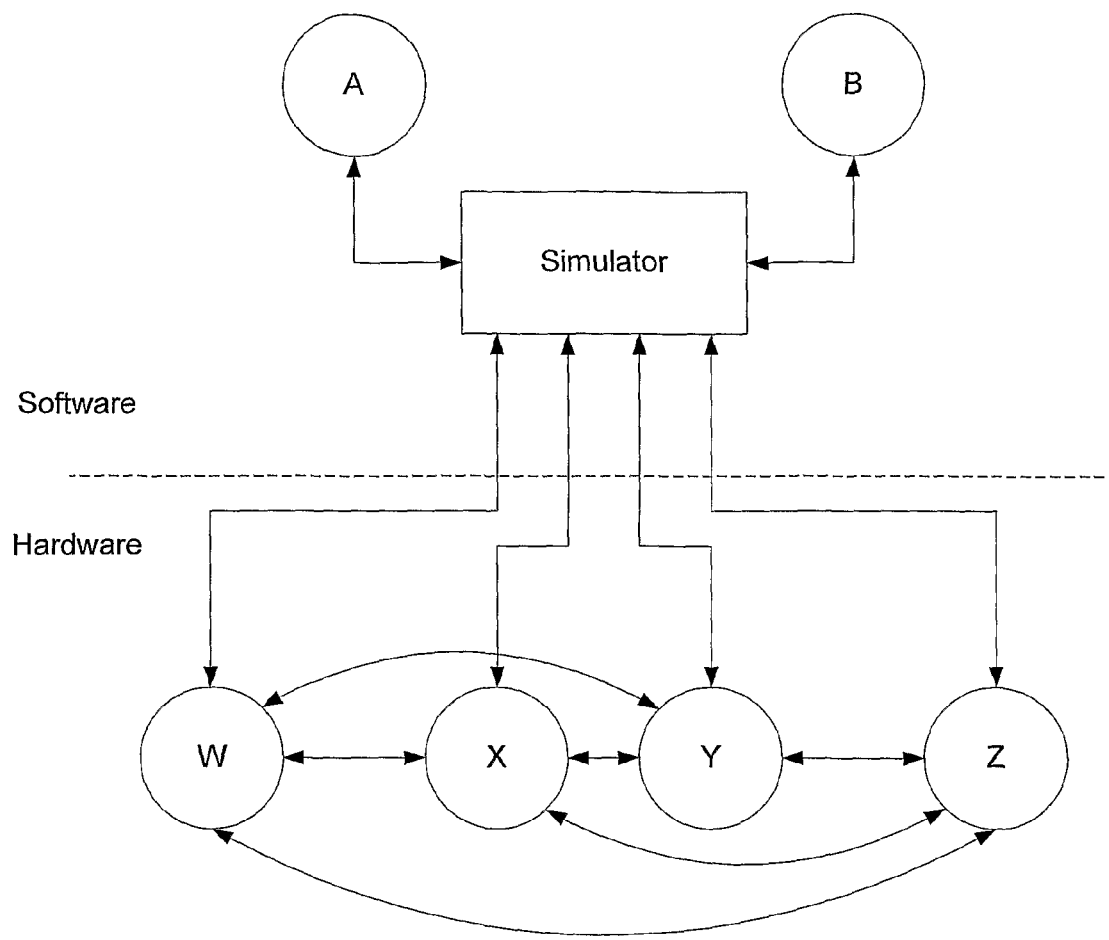

Embodiments of the present invention will now be described, by way of example only, with reference to the accompanying drawings, in which:

FIG. 1 schematically illustrates a prior art modelling process for modelling components of a system at different levels of abstraction;

FIG. 2 schematically illustrates a protocol tree suitable for use in embodiments of the present invention;

FIG. 3 schematically illustrates a compilation process for modelling and simulation methods in accordance with embodiments of the present invention;

FIG. 4 schematically illustrates a reduced hierarchy of levels of abstraction suitable for use in modelling and simulation systems in accordance with embodiments of the present invention;

FIG. 5 schematically illustrates a modelling and simulation system suitable for modelling interrelated components at different levels of abstraction in accordance with embodiments of the present invention;

FIG. 6 schematically illustrates a modelling and simulation system suitable for modelling interrelated components implemented in hardware and software in accordance with embodiments of the present invention;

FIG. 7 schematically illustrates a modelling and simulation system suitable for modelling interrelated components implemented in hardware and software in accordance with further embodiments of the present invention;

FIG. 8 schematically illustrates the difference between modelled components implemented in hardware and software in accordance with embodiments of the present invention;

FIG. 9 schematically illustrates two interrelated components implemented in hardware in accordance with embodiments of the present invention;

FIG. 10 schematically illustrates a modelling and simulation system in accordance with an embodiment of the present invention; and FIG. 11 schematically illustrates a modelling and simulation system in accordance with a further embodiment of the present invention Referring to FIG. 1, there is illustrated a modelling process known from the prior art, in which different system components are specified at different levels of abstraction. A system model 1 is specified at a relatively high level in a programming language known as CY. Although the prior art and embodiments of the present invention are described using CY it will be readily apparent to those skilled in the art that alternative programming languages may be used in a similar manner. Other components of the system are specified at lower levels of abstraction. For example, two components are specified as behavioural models 2, 3 respectively using system C and VHDL. Similarly, two further components 4, 5 are specified at RTL using VHDL and Verilog respectively. It will be appreciated that each programming language could be replaced with an alternative programming language.

FIG. 1 therefore contains a number of models at different levels of abstraction. The models are simulated concurrently. Interactions between the models are defined by interfaces 6, 7, 8, which are again specified in the computer language CY.

In the prior art modelling and simulation method depicted in FIG. 1, a multilevel model is specified in CY. This CY model is then compiled into a form in which it can be simulated. A compiler converts the CY code to C++ in a form in which it can be passed to a simulator. The simulation process can be used to model components at varying levels of abstraction. The modelling and simulation method of FIG. 1 is implemented entirely in software.

As described above, it is desirable to be able to simulate different components of a system at different levels of abstraction, with some components modelled and implemented in software and some components modelled and implemented in hardware.

A protocol tree is concerned with the way in which objects at different levels of abstraction are related. A protocol tree, including the relationships specified in the protocol tree, suitable for use in accordance with embodiments of the present invention is illustrated in FIG. 2. Each object A, B, W, X, Y, Z can represent a component of the system being modelled, data passed between components, an activity carried out by a component or any other type of information. Object A is shown as having two children, W and X. Conversely, A is the parent of W and X. Object A is a model of a component at a relatively high level of abstraction. W and X are models of components at a relatively low level of abstraction. Together, W and X completely define component A. That is, in operation W and X provide all of the functions of their parent. Similarly, component B has two children Y and Z (and B is the parent of both Y and Z).

Referring to FIG. 3, the compilation process for a modelling and simulation method in accordance with embodiments of the present invention will now be described. A model specification 30 is created in the programming language CY. This specification 30 is passed through a compiler 31 which converts the CY code to at least one further programming language. The further programming language is dependent upon whether an individual component is to be modelled and implemented in hardware or software. The compiled code essentially comprises five components.

A first component 32 comprises function algorithms, which define how the modelled components operate. Function algorithms 32 define the functionality of models within the modelled system. This functionality can either be specified in the CY source code, or alternatively, the CY source code may simply provide a header indicating where the functionality is to be found. The function algorithms 32 are created from the definitions provided within the unit specifications.

A second component 33, the model shape, defines the shape of the modelled system in terms of the modelled components and how they relate to one another. The model shape 33 specifies which components communicate with which other components and by means of which interfaces. This can be deduced from the CY code by the compiler 31.

A third component 34 is a protocol tree, which specifies the relationships between components at different levels of abstraction. Referring back to FIG. 2, this is an example of such a protocol tree.

A fourth component 35 comprises generation algorithms, which are used to generate relatively low level objects from higher level objects.

Finally, a fifth component 36 comprises recognition algorithms, which are used to recognise relatively high level objects from one or more lower level objects.

Assuming that all of the components of the system are modelled using the common language CY, which is then in turn used by the compiler 31 to generate further computer programs in the appropriate computing languages, then the modelling and simulation process shown in FIG. 3 can be used to model components within a system at varying levels of abstraction.

In accordance with some embodiments of the present invention, a single model specification 30 written in CY is compiled within compiler 31 into two or more computer programs written in two or more computing languages. Specifically, in some embodiments of the present invention interrelated components within the modelled system are implemented separately in software and in hardware. The compiler is responsible for determining which components are implemented in hardware and which are implemented in software. The compiler 31 is responsible for taking the CY source code and converting CY code that specifies components to be implemented in software into computer code suitable for implementing in software (such as C++). The compiler also takes the CY source code that specifies components to be implemented in hardware and converts that CY code into computer code suitable for implementing in hardware (such as VHDL or Verilog).

The generation and recognition algorithms are compiled from the CY source code 30. In accordance with an embodiment of the present invention, for components of the modelled system implemented in hardware, the generation algorithm and the recognition algorithm may be implemented by a single block of code compiled from the CY language into, for instance, Verilog. This single combined generation and recognition algorithm is context dependent. That is, whether generation or recognition takes place is dependent upon the inputs that are passed to the generation/recognition algorithm.

With reference to FIG. 2, if the input to the generation/recognition algorithm is a single component, such as component A, then the generation/recognition algorithm knows that this component has two children, therefore it generates instances of components W and X. That is, when A is generated it can be deduced that the lower level W and X must also be generated. Conversely, if the input to the generation/recognition algorithm is components W and X then the generation/recognition algorithm recognises that the parent of these two components is component A and consequently instantiates an instance A.

As such, components A and B are at a higher level of abstraction than components W, X, Y and Z. As described above, components can be implemented either in hardware or software. One possible split is shown in FIG. 2, whereby components at the higher level (A and B) are implemented in software, and components at the lower level (W, X, Y and Z) are implemented in hardware. However, the present invention is not limited to this. In certain embodiments of the present invention any component or any group of components can be implemented either in hardware or software. In other embodiments of the present invention, it may be that it is impossible or impractical to implement certain components in hardware. In such embodiments, these considerations are taken into account by the compiler 31 in determining which components to implement in hardware.

For components modelled in software each component can be modelled at any level of abstraction. Within a system modelled in software there can be any number of components modelled at different levels. However, for components modelled and implemented in software in a modelling and simulation system in accordance with embodiments of the present invention it is advantageous to restrict the number of levels of abstraction.

Referring now to FIG. 4, this schematically represent a standardised series of levels of abstraction suitable for use for modelling and implementing components of a system in hardware. It is desirable to standardise the number of levels of abstraction as this facilitates developers working in isolation on different components of a modelled system to produce modelled components at standardised levels of abstraction. However, it will be readily apparent to the appropriately skilled person that the precise number of levels of abstraction can differ.

FIG. 4 shows four levels of abstraction at which individual components can be modelled. In addition, and for completeness, the Algorithmic Level and the Gate Level are shown, although the present invention is not concerned with modelling components at these levels. Each level of abstraction is schematically represented, and the relationships between neighbouring levels of abstraction are shown by the braces, which relate one level, or one part of a level, of abstraction to the next level.

At the Algorithmic Level (AL) the system is represented by a series of functions. There is no communication between the individual functions, rather they are schematically depicted as being performed one after another. There is no consideration of the time taken to perform each function.

The first modelled level of abstraction is the Programmers View (PV). The PV level comprises a series of un-timed functions, however consideration is given to communication between the different functions. Each function is considered to be a discrete event. Also, at the PV level, functions or groups of functions may operate in parallel. There may not be a one to one mapping between functions at the AL level and at the PV level (as shown in FIG. 4). The PV level is closer to how a programmer would understand the sequence of events making up a program in a high level programming language, such as C++.

The second modelled level of abstraction is the Programmers View with Timing (PVT). The PVT level introduces the consideration of timing into each function from the PV level. For instance, function 40 is shown taking the same amount of time as functions, 41 and 42 which are performed sequentially in parallel with function 40. The timing at the PVT level is approximate.

The third modelled level of abstraction is the Cycle Callable (CC). At the CC level timing is based on the number of clock cycles taken per function. That is, for each function the start and finish times are known. Each function takes n clock cycles. FIG. 4 schematically depicts function 40 at the PVT level being modelled as a series of functions 43 at the CC level. At the CC level it is not known when, during each function, the outputs are generated.

The fourth modelled level of abstraction is the Cycle Accurate/Register Transfer Level (CA/RTL). At the CA/RTL level each function or sub group of functions from the CC level is represented by a sequentially executed series of functions, each taking one clock cycle. As such, the precise timing of the outputs from each function is known to the nearest clock cycle.

Finally, FIG. 4 depicts the Gate Level (GL). The GL level depicts each function or sub group of functions from the CA/RTL as being implemented in hardware as a logic gate or a series of logic gates. The present invention is not concerned with modelling systems at the GL level.

Referring now to FIG. 5, this schematically illustrates a modelling and simulation system. The system is shown as two interrelated components 50 and 51, which are modelled in software at the PV level and the CA level respectively. Translator 52, also implemented in software, translates data passed between components 50 and 51 between the PV level and the CA/RTL level. When passed in a first direction (shown by arrow 53) the translator converts high level transactions into low level stimuli, which are passed to component 51. When passed in a second direction (shown by arrow 54) the translator converts low level results from component 51 to high level transactions for component 50. Translator 52 is initially written in the programming language CY. Components 50 and 51 may also be written in CY. Alternatively, components 50 and 51 may be written in one or more other computer programming languages.

FIG. 6 depicts a modelling and simulation system in accordance with an embodiment of the present invention. As before, the system is shown as two interrelated components 60 and 61, which are respectively modelled at the PV level and the CA level. However, component 60 is modelled and implemented in software and component 61 is modelled and implemented in hardware.

As discussed above in the introduction, there is no known method of automatically and accurately simulating a system when parts of the system are specified and modelled in software at a high level (e.g. system level) and parts of the system are specified and modelled in hardware at a low level (e.g. RTL). It is an aim of some embodiments of the present invention to enable RTL models and test implemented in software to communicate with models implemented in hardware in an efficient manner. For communication between software and hardware models the known Standard Co-Emulation Modelling Interface (SCE-MI) is used for transferring data between the software and hardware components.

The translator for passing data between the hardware and software components is implemented in two halves and split between the software part of the simulation system and the hardware emulator part of the simulation system. A first half of the translator 62 is implemented in software. As information is passed from software to hardware at the PV level (via the SCE-MI interface) it is not necessary to the software half of the translator 62 to translate information in software to a level of abstraction lower than the PV level. Therefore, the software half of the translator 62 only comprises the PV level. A second half of the translator 63 is implemented in hardware. The hardware half of the translator is shown at all levels from PV to CA/RTL as the hardware half of the translator 63 is responsible to converting high level transactions from component 60 into low level stimuli, which are passed to component 61. The hardware half of the translator 63 converts low level results from component 61 to high level transactions for component 60.

As for FIG. 5, the translator 62, 63 is initially written in CY, before each half is converted to a suitable further programming language (such as C++ for the software implemented half and Verilog for the hardware implemented half).

Communication between the parts of the translator is depicted as taking place at the PV level, however it could equally take place at any other level. It is desirable that communication between the software part of the translator 62 and the hardware part of the translator 63 takes place at as high a level of abstraction as possible in order to minimise the total amount of data that is transferred and bottlenecks due to synchronisation of data exchange between hardware and software components. The components connected via translator 62, 63 could be modelled and implemented at any level of abstraction. In certain embodiments of the present invention component 61 is implemented at the CA/RTL level. By implementing components modelled at the CA/RTL level in hardware the speed of simulation of the system is increased.

FIG. 7 depicts a similar simulation system to FIG. 6 in which the system is shown as two interrelated components 70 and 71, which are respectively modelled at the CC level and the CA level. However, component 70 is modelled and implemented in software and component 71 is modelled and implemented in hardware. Similarly to FIG. 6, as information is passed from software to hardware at the CC level (via the SCE-MI interface) it is not necessary for a software half of a translator 72 to translate information in software to a level of abstraction lower than the CC level. However, levels of abstraction above the CC level are required in the software half of the translator 72 in order to allow recognition of components higher in the protocol tree for components (such as messages and data) passed by the translator. Therefore, the software half of the translator 72 only comprises levels of abstraction above the CC level. A second half of the translator 73 is implemented in hardware. The hardware half of the translator is shown at all levels from PV to CA/RTL. As for the software half of the translator 72 levels of abstraction above the CC level at which the data is exchanged are required to allow for recognition. The hardware half of the translator 63 is responsible to converting high level transactions from component 60 into low level stimuli, which are passed to component 61. The hardware half of the translator 73 converts low level results from component 61 to high level transactions for component 72.

A first half of the translator 72 is implemented in software. A second half of the translator 73 is implemented in hardware. The SCE-MI interface is used to communicate between the two halves of the translator 72, 73 at the CC level.

Communication between the parts of the translator is depicted as taking place at the CC level. As component 70 is implemented at the CC level the software part of the translator 72 is not required to convert the data to a different level of abstraction before passing the data to the hardware part of the translator 73. The hardware part of the translator 73 is responsible for converting CC level data to CA/RTL level data, and vice versa (as shown by arrow 74).

Referring now to FIG. 8, this illustrates the difference between modelled components that are implemented in software and modelled components implemented in hardware, in accordance with an embodiment of the present invention.

Component A is implemented in software. Component A comprises a Finite State Machine (FSM). The FSM within component A has inputs 80 and outputs 81, which allow the FSM to receive and send data from and to other components respectively. For components implemented in software there is a separate simulator entity (not shown in FIG. 8) responsible for managing the simulation. Software implemented components do not communicate directly with each other, rather they communicate via the simulator. The order in which events occur and the order in which components undertake simulated activity is determined by the simulator. If component A at run time requires service it sends a request to the simulator, which allocates the task to the processor.

Component X is implemented in hardware. In addition to having a FSM, component X has a simulation entity 82. The simulation entities for each modelled component implemented in hardware communicate with each other to collectively provide a Distributed Simulation System (DSS). The DSS is responsible for determining the order in which events occur and the order in which components undertake simulated activity.

The DSS is defined by the model specification for that component written in CY (CY source code 30 in FIG. 3). The CY code for each component comprises a component specification. The specification for each component comprises a functional specification and an associated simulation element. The functional specification defines the operation of the component, defines the FSM for that component and is used within the simulation system to simulate the operation of the component. The simulation element defines the operation of the DSS, and how that component communicates with other components.

In accordance with an embodiment of the present invention the CY source code for the DSS element for each component is provided by template code within the compiler. The compiler is arranged to insert appropriate CY code for the DSS elements when compiling the modelled system.

The DSS element 82 in component X is responsible for handling all communication with other components from the FSM. Inputs 83 and outputs 84 connect to the DSS 82, which in turn passes data to the FSM via FSM inputs and outputs 85 and 86 respectively. Each DSS element is responsible for resource management and communications within that component and communication with other components. Due to the inherent parallelism in hardware, each hardware implemented component is able to process activities independently of other components.

The distributed simulation system comprises six components. The first component of the DSS handles generation triggers. The DSS comprises a bidirectional multiplexer in which multiple inputs and outputs going from and to other components are multiplexed onto a reduced number of communication links to the FSM. When a generation trigger is received, the generation trigger is passed to the FSM and used to trigger the generation of an instance of that component in response to the generation of a parent component at a higher level of abstraction or a trigger from a software implemented component. A generation event can occur as soon as the generation trigger is received by the DSS element of a first component. When generation is complete, an indication of completion is passed to the initiating item. If multiple generation triggers are received then these are distributed to appropriate resources. If insufficient resourced are available then generation triggers are queued until resource becomes available.

The second component of the DSS handles recognition triggers. When all of the children of a component are generated or recognised the DSS provides a recognition trigger indicating that an instance of the parent component is required. Alternatively, the recognition trigger may be provided when any of the children of a component are generated or recognised. For a recognition event to occur it may be necessary to wait until a series of events have occurred, i.e. all of the child components have been generated or recognised. Therefore, the DSS in conjunction with the FSM keeps track of the sequence of events that have occurred, in order to identify when a recognition event is to be triggered. In addition, when lower level components are attempting to be recognised, indication of this is passed up through the hierarchy of components to maintain the state of the modelled system. However only when a lower level component is instantiated (i.e. generated or itself recognised) can higher level components actually be recognised.

The third component of the DSS is a parameters block. This is responsible for handling parameters passed between generated and recognised components during the operation of those components. The parameters block is also responsible for ensuring that the parameters are correctly stored within that component. During a generation event the parameters block for a generated child component can be populated with parameters immediately. However, for a recognition event, the parameters block of the recognised parent block is populated over a period of time, during which the child components are generated or themselves recognised. When a component is finished with a copy of its parameters are passed to its generating parents or recognising children components so that its resources may be reused immediately, for instance by using those resources to generate or recognise another component.

The fourth component of the DSS is responsible for object timing with respect to other objects. The start and end times of components are determined by the hierarchy of elements directly below that component. Start and end times are passed to hierarchically higher level hardware implemented components. The hierarchy of components is defined by the protocol tree 34. Start and end times are then passed to software implemented components so that component timings are consistent between hardware and software implemented components.

The fifth component of the DSS is responsible for notifying software implemented components when a hardware component has completed operation.

The sixth component of the DSS is responsible for synchronisation of simulation time between the parts of a simulator implemented in hardware (i.e. the DSS) and parts of the simulator implemented in software. It receives messages from the software part of the simulator to progress the hardware parts of the simulation and controls the clock being applied to the hardware implemented components. The sixth component of the DSS sends messages back to the software part of the simulator either once a hardware component has completed processing its task or some other message needs to be sent (e.g. another component is complete so requires to notify the software). There is only one instance of the sixth component of the DSS due to the fact that it is responsible for synchronising simulation timing between hardware and software implemented components. As such, the sixth element of the DSS is located externally to each hardware implemented component. Individual hardware implemented components may include uncontrolled clocks for internal timing purposes. The sixth component of the DSS is not explicitly shown in FIGS. 9 to 11.

For both software and hardware implemented components a finite state machine (FSM) is responsible for implementing the functionality of that component. Additionally, the FSM defines the hierarchical structure of the protocol tree, including optional protocol elements (i.e. an item may in one instantiation consist of two children, and in another instantiation consist of three children) and timing relationships between elements.

Referring to FIG. 9, this schematically illustrates two components X and Y, both of which are implemented in hardware. X and Y both incorporate a DSS element 82. The DSS elements 82 are shown as having a plurality of bidirectional inputs and outputs. These communication links are split into those for communicating with software components (via a software simulator) and those for communicating with other hardware implemented components. As shown in FIG. 9, hardware implemented components can communicate directly with other hardware implemented components via the distributed simulation system.

Referring now to FIG. 10, this illustrates a modelling and simulation system in accordance with an embodiment of the present invention. The system is shown having four interrelated components. Two of the components, A and B, are implemented in software. A and B communicate with each other and other components via a software simulator 100. The other two components, X and Y, are implemented in hardware. X and Y can communicate with each other directly as shown by line 101. In order to communicate with components A and B, components X and Y communicate with the software simulator 100. The form of communication for X and Y is therefore dependent upon whether the other component with which it is communicating is a hardware implemented component or a software implemented component. Conversely, for A and B the mode of communication is always the same as A and B can only send data via the simulator.

The model for a first hardware component specifies which other components that first component is aware of. For instance, for the system of FIG. 10, the model for component X includes information about component Y. Component X knows that component Y is implemented in hardware. As such, if component X is required to communicate with component Y it will only send data via link 101. Similarly, component X knows that component A is implemented in software. Therefore, to communicate with component A, component X will only send data via the link to the software simulator 102. However, the model for component X does not include knowledge of component B. Therefore, if component X is required to communicate with component B then it sends a request over both link 102 to the software simulator and link 101 to the other hardware components (in this case just component Y). Component X will then only get a response from one link. Component X will continue to communicate with both the software simulator and the other hardware components when attempting to communicate with component B. In accordance with an alternative embodiment of the present invention, component X could alternatively only attempt to communicate with component B via its links with other hardware components.

FIG. 11 shows a similar system to FIG. 10, except that now there are four hardware implemented components. FIG. 11 shows that there are direct communications links between every pair of hardware implemented components.

Other modifications and advantages of the present invention will be readily apparent to the appropriately skilled person, without departing from the scope of the appended claims.

The invention claimed is:

1. A method for modeling and simulating a system comprising first and second interrelated components, the method comprising:
modeling the behavior of said first and second components using first and second specifications, each of said first and second specifications including a functional specification and an associated simulation element; and
simulating the behavior of said first and second components using said first and second specifications;
wherein the simulation elements communicate with one another to provide a simulation system;
wherein the first component is modeled in hardware and the second component is modeled in software.

2. A method according to claim 1, wherein said simulation system manages communication between the first and second specifications representing the first and second components.

3. A method according to claim 1, wherein said simulation system determines the order in which the first and second specifications representing the first and second components process events.

4. A method according to claim 1, wherein said step of simulating further comprises instantiating at least one first entity within a hierarchy of interrelated entities, said at least one first entity being defined by at least one of said first and second functional specifications.

5. A method according to claim 4, further comprising instantiating at least one further entity in response to each instantiated first entity, the or each further entity being defined by at least one of the first and second functional specifications, and the or each further entity being selected by the simulation system on the basis of its hierarchical relationship with the at least one first entity.

6. A method according to claim 5, wherein said first and second components are represented by respective entities in said hierarchy of interrelated entities, and instances of the respective entities are created.

7. A method according to claim 5 or claim 6, wherein the at least one further entity is a parent of the at least one first entity in the hierarchy of interrelated entities.

8. A method according to claim 5, wherein the at least one further entity is a child of the at least one first entity in the hierarchy of interrelated entities.

9. A method according to claim 5, wherein an entity within the hierarchy is instantiated to represent data transmitted between the first and second components, and communication between the first and second specifications representing the first and second components is modeled.

10. A method according to claim 5, wherein the first component is modeled at a higher level of abstraction than the second component, and the method comprises providing details of the relationship between the first and second components using said hierarchy.

11. A method according to claim 5, wherein hierarchical relationships between the entities are deduced from at least one of the first and second functional specifications.

12. A method according to claim 1, wherein said first and second specifications are specified as a first computer program written in a first computer programming language.

13. A method according to claim 12, further comprising specifying relationships between said first and second specifications in the first computer program.

14. A method according to claim 12, further comprising processing said first computer program to generate a second computer program.

15. A method according to claim 14, wherein said processing translates said first computer program from the first computer programming language to a second computer programming language.

16. A method according to claim 15, wherein said second computer programming language is VHDL or Verilog.

17. A method according to claim 14, further comprising:
generating implementations of said first and second components in hardware based upon said second computer program.

18. A method according to claim 14, wherein said processing comprises inserting additional computer code into said second computer program, said additional computer code implementing the or each simulation element.

19. A method according to claim 14, wherein the second computer program comprises an implementation of a finite state machine configured to instantiate entities at a higher hierarchical level on the basis of at least one entity at a lower hierarchical level in response to the simulation.

20. A method according to claim 14, wherein the second computer program comprises an implementation of a finite state machine configured to instantiate entities at a lower hierarchical level on the basis of at least one entity at a higher hierarchical level in response to the simulation.

21. A method according to claim 14, wherein the second computer program comprises an implementation of a finite state machine configured to instantiate entities at both higher and lower hierarchical levels on the basis of at least one entity at a lower or a higher hierarchical level respectively in response to the simulation.

22. A method according to claim 12, further comprising processing said first computer program to generate a second computer program and a third computer program.

23. A method according to claim 22, wherein said processing translates said first computer program from the first computer programming language to second and third computer programming languages respectively.

24. A method according to claim 23, wherein said second computer programming language is VHDL or Verilog and said third computer programming language is C or C++.

25. A method according to claim 1, further comprising:
modeling the behavior of at least one further component using at least one further functional specification;
generating an implementation of said at least one further component in software based upon said at least one further functional specification; and
simulating the behavior of said at least one further component using said at least one further functional specification.

26. A method according to claim 25, further comprising the step of providing a software implemented simulation system for managing communication between said first and second components and said at least one further component.

27. A method according to claim 26, further comprising said first and second specifications representing the first and second components attempting to communicate with further components simultaneously via the software implemented simulation system and via other specifications representing other components implemented in hardware.

28. A carrier medium carrying computer readable code for controlling a computer to carry out the method of claim 1.

29. A computer apparatus for modeling and simulating a system, the apparatus comprising:
a program memory storing processor readable instructions; and
a processor configured to read and execute instructions stored in said program memory;
wherein the processor readable instructions comprise instructions controlling the processor to carry out the following method: modeling the behavior of said first and second components using first and second specifications, each of said first and second specifications including a functional specification and an associated simulation element; and
simulating the behavior of said first and second components using said first and second specifications, wherein the first component is implemented in hardware and second component is implemented in software;
wherein the simulation elements communicate with one another to provide a simulation system.

30. A programmable computing device comprising:
storage means storing first and second specifications, said first and second specifications respectively modeling the behavior of first and second components, one in hardware and the other in software, and each of said first and second specifications including a functional specification and a simulation element;
processing means configured to simulate the behavior of said first and second components using said first and second specifications;
wherein said simulation elements are configured to communicate with one another to provide a simulation system.

31. An apparatus for modeling and simulating a system comprising first and second interrelated components, the apparatus comprising:
modeling means for modeling the behavior of said first and second components using first and second specifications, each of said first and second specifications including a functional specification and an associated simulation element; and
simulation means for simulating the behavior of said first and second components using said first and second specifications, wherein the first component is implemented in hardware and the second component is implemented in software;
wherein the simulation elements communicate with one another to provide a simulation system.

32. A method for modeling and simulating a system comprising a component, the method comprising:
modeling the behavior of the component using a specification specified in a first computer program written in a first computer programming language;
processing the first computer program to generate a second computer program;
generating an implementation of the component based on the second computer program;
and simulating the behavior of the component using the generated implementation by instantiating a first entity within a hierarchy of entities;
wherein the second computer program comprises an implementation of a finite state machine configured to instantiate entities at both higher and lower levels within the hierarchy of entities in response to the simulation.

33. A programmable computing device comprising:
storage means storing a specification, said specification modeling a behavior of a component, and the specification being specified in a first computer program;
first processing means configured to process the first computer program to generate a second computer program;
generating means configured to generate an implementation of the component based on the second computer program; and
second processing means configured to simulate behavior of the component using the generated implementation by instantiating a first entity within a hierarchy of entities;
wherein the second computer program comprises an implementation of a finite state machine configured to instantiate entities at both higher and lower levels within the hierarchy of entities in response to the simulation.

34. An apparatus for modeling and simulating a system comprising a component, the method comprising:
modeling means for modeling the behavior of the component using a specification specified in a first computer program written in a first computer programming language;
processing means for processing the first computer program to generate a second computer program;
generation means for generating an implementation of the component based on the second computer program; and
simulation means for simulating the behavior of the component using the generated implementation by instantiating a first entity within a hierarchy of entities;
wherein the second computer program comprises an implementation of a finite state machine configured to instantiate entities at both higher and lower levels within the hierarchy of entities in response to the simulation.

35. A method for modeling and simulating a system comprising first and second interrelated components, the method comprising:
modeling the behavior of said first and second components using first and second specifications specified in a computer program in a first computer programming language;

processing said computer program to generate second and third computer programs in second and third computer programming languages respectively;

generating an implementation of the first component in hardware based on the second computer program;

generating an implementation of the second component in software based on the third computer program; and simulating the behavior of the first component and the second component using the generated implementation of the first component and the generated implementation of the second component respectively.

36. A programmable computing device comprising:

storage means storing first and second specifications, said first and second specification respectively modeling the behavior of said first and second components, said first and second specification being specified in a computer program in a first computer programming language;

processing means configured for processing said computer program to generate second and third computer programs in second and third computer programming languages respectively;

first generation means configured for generating an implementation of the first component in hardware based on the second computer program;

second generation means configured for generating an implementation of the second component in software based on the third computer program;

and simulation means configured for simulating the behavior of the first component and the second component using the generated implementation of the first component and the generated implementation of the second component respectively.

37. An apparatus for modeling and simulating a system comprising a component, the apparatus comprising:

modeling means for modeling the behavior of said first and second components using first and second specifications specified in a computer program in a first computer programming language;

processing means for processing said computer program to generate second and third computer programs in second and third computer programming languages respectively;

first generation means for generating an implementation of the first component in hardware based on the second computer program; second generation means for generating an implementation of the second component in software based on the third computer program; and simulation means for simulating the behavior of the first component and the second component using the generated implementation of the first component and the generated implementation of the second component respectively.

* * * * *